(12) United States Patent
Bao et al.

(10) Patent No.: US 11,024,711 B2
(45) Date of Patent: Jun. 1, 2021

(54) NANOSHEET FET BOTTOM ISOLATION

(71) Applicant: International Business Machines Corporation, Armonk, NY (US)

(72) Inventors: Ruqiang Bao, Niskayuna, NY (US); Zhenxing Bi, Dunn Loring, VA (US); Kangguo Cheng, Schenectady, NY (US); Zheng Xu, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/687,734

(22) Filed: Nov. 19, 2019

(65) Prior Publication Data

US 2020/0135853 A1   Apr. 30, 2020

Related U.S. Application Data

(62) Division of application No. 16/174,603, filed on Oct. 30, 2018.

(51) Int. Cl.
*H01L 29/06* (2006.01)
*H01L 29/08* (2006.01)
(Continued)

(52) U.S. Cl.
CPC .... *H01L 29/0669* (2013.01); *H01L 21/02603* (2013.01); *H01L 21/762* (2013.01); *H01L 29/0653* (2013.01); *H01L 29/0847* (2013.01)

(58) Field of Classification Search
CPC . H01L 29/0653; H01L 29/0847; H01L 29/06; H01L 29/08; H01L 29/66; H01L 29/267; H01L 29/786; H01L 29/775; H01L 29/0673; H01L 29/78696; H01L 29/66439; H01L 29/068; H01L 29/0669; H01L 29/0665; H01L 29/66469; H01L 29/7853; H01L 29/78687; H01L 29/7858; H01L 29/0843; H01L 29/0891; H01L 29/66636; H01L 29/36; H01L 29/66643; H01L 29/22; H01L 29/365; H01L 29/2206; H01L 29/20; H01L 29/2006; H01L 29/18; H01L 29/16; H01L 29/1608; H01L 29/04; H01L 29/045; H01L 29/1033; H01L 29/1054;
(Continued)

(56) References Cited

U.S. PATENT DOCUMENTS 6,580,137 B2   6/2003 Parke
7,229,895 B2   6/2007 Wells
(Continued)

OTHER PUBLICATIONS

A.H. Baek, et al; "Ferroelastic switching for nanoscale non-volatile magnetoelectric devices"; Nature Materials vol. 9; Macmillan Publishers Limited; Apr. 2010; 309-314.
(Continued)

*Primary Examiner* — Chuong A Luu
(74) *Attorney, Agent, or Firm* — Cantor Colburn LLP; Randall Bluestone

(57) ABSTRACT

A technique relates to a semiconductor device. A rare earth material is formed on a substrate. An isolation layer is formed at an interface of the rare earth material and the substrate. Channel layers are formed over the isolation layer. Source or drain (S/D) regions are formed on the isolation layer.

20 Claims, 13 Drawing Sheets

(51) Int. Cl.
*H01L 21/762* (2006.01)
*H01L 21/02* (2006.01)

(58) Field of Classification Search
CPC . H01L 29/78; H01L 29/7926; H01L 29/6684;
H01L 29/66477; H01L 21/02; H01L
21/762; H01L 21/02603; H01L 21/02581;
H01L 21/0256; H01L 21/02192; H01L
21/823412; H01L 21/823807; H01L
21/8234; H01L 21/8249; H01L
21/823418; H01L 21/823425; H01L
21/823814; H01L 2029/7858; H01L
2924/01105
USPC .............................................. 257/29, 24, 401
See application file for complete search history.

(56) References Cited

U.S. PATENT DOCUMENTS

| | | | |
|---|---|---|---|
| 7,368,365 B2 | 5/2008 | Wells | |
| 7,407,847 B2 | 8/2008 | Doyle et al. | |
| 7,465,642 B2 | 12/2008 | Cheng et al. | |
| 7,538,386 B2 | 5/2009 | Jang | |
| 7,601,608 B2 | 10/2009 | Wells | |
| 7,648,864 B2 | 1/2010 | Bojarczuk, Jr. et al. | |
| 7,759,203 B2 | 7/2010 | Jang | |
| 7,768,073 B2 | 8/2010 | Wells | |
| 7,808,032 B2 | 10/2010 | He et al. | |
| 7,811,881 B2 | 10/2010 | Cheng et al. | |
| 7,825,470 B2 * | 11/2010 | Atanakovic | H01L 29/4908 257/347 |
| 8,102,008 B2 | 1/2012 | Wells | |
| 8,217,435 B2 | 7/2012 | Chang et al. | |
| 8,569,812 B2 | 10/2013 | Chang et al. | |
| 8,569,830 B2 | 10/2013 | Oyu et al. | |
| 8,373,226 B2 | 12/2013 | Taketani | |
| 8,609,480 B2 | 12/2013 | Xie | |
| 8,692,316 B2 | 4/2014 | Xie | |
| 8,697,522 B2 | 4/2014 | Cheng et al. | |
| 8,853,781 B2 | 10/2014 | Cheng et al. | |
| 8,859,358 B2 | 10/2014 | Wang et al. | |
| 8,872,172 B2 | 10/2014 | Cheng et al. | |
| 8,980,707 B2 | 3/2015 | Chang et al. | |
| 9,214,557 B2 | 12/2015 | Tan et al. | |
| 9,245,883 B1 | 1/2016 | Lin et al. | |
| 9,257,325 B2 | 2/2016 | Knorr et al. | |
| 9,275,999 B2 | 3/2016 | Chang et al. | |
| 9,373,641 B2 | 6/2016 | Anderson et al. | |
| 9,418,997 B2 | 8/2016 | Chang et al. | |
| 9,496,372 B2 | 11/2016 | Lin et al. | |
| 9,496,397 B2 | 11/2016 | Ching et al. | |
| 9,520,399 B2 | 12/2016 | Chang et al. | |
| 9,553,012 B2 | 1/2017 | Lee et al. | |
| 9,553,186 B2 | 1/2017 | Kim | |
| 9,583,507 B2 | 2/2017 | Cheng et al. | |
| 9,589,827 B2 | 3/2017 | Cheng et al. | |
| 9,881,998 B1 | 1/2018 | Cheng et al. | |
| 9,984,936 B1 | 5/2018 | Xie et al. | |
| 2009/0085115 A1* | 4/2009 | Atanackovic | H01L 29/78603 257/347 |
| 2010/0175755 A1* | 7/2010 | Singh | H01L 51/4226 136/258 |
| 2013/0320413 A1* | 12/2013 | Wang | H01L 29/7849 257/288 |
| 2013/0334536 A1 | 12/2013 | Dargis et al. | |
| 2014/0167163 A1 | 6/2014 | Cheng et al. | |
| 2016/0071729 A1 | 3/2016 | Hatcher et al. | |
| 2017/0062484 A1* | 3/2017 | Hsu | H01L 27/1225 |
| 2017/0069481 A1* | 3/2017 | Doris | H01L 29/42392 |
| 2018/0219064 A1 | 8/2018 | Cheng et al. | |
| 2019/0122885 A1* | 4/2019 | Dargis | H01L 21/02381 |
| 2020/0135852 A1 | 4/2020 | Bao et al. | |

OTHER PUBLICATIONS

Engstrom, J. R.et al; The reaction of atomic oxygen with Si(100) and Si(111); Surface Science 268; Elsevier Science Publishers B.V.; 1992; 238-264.

List of IBM Patents or Patent Applications Treated As Related; (Appendix P); Date Filed: Nov. 19, 2019, 2 pages.

N. Loubet et al., "Stacked nanosheet gate-all-around transistor to enable scaling beyond FinFET," Symposium on VLSI Technology, 2017, pp. T230-T231.

Ruqiang Bao et al., "Nanosheet FET Bottom Isolation," U.S. Appl. No. 16/174,603, filed Oct. 30, 2018.

Takashi Fuyuki et al; "Initial state of ultra-thin SiO2 formation at low temperatures using activated oxygen"; Applied Surface Science 117/118 (1997), 123-126.

V. Narayanan, et al; "Interfacial oxide formation and oxygen diffusion in rare earth oxide-silicon epitaxial heterostructures" Applied Physics Letters, vol. 81, No. 22; 4183-4185; Nov. 2002.

W.F. Xiang et al.;"In situ RHEED analysis of epitaxial Gd2O3 thin films grown on Si (001)"; Applied Physics A, Materials Science & Processing; 110:423-426 (2013).

* cited by examiner

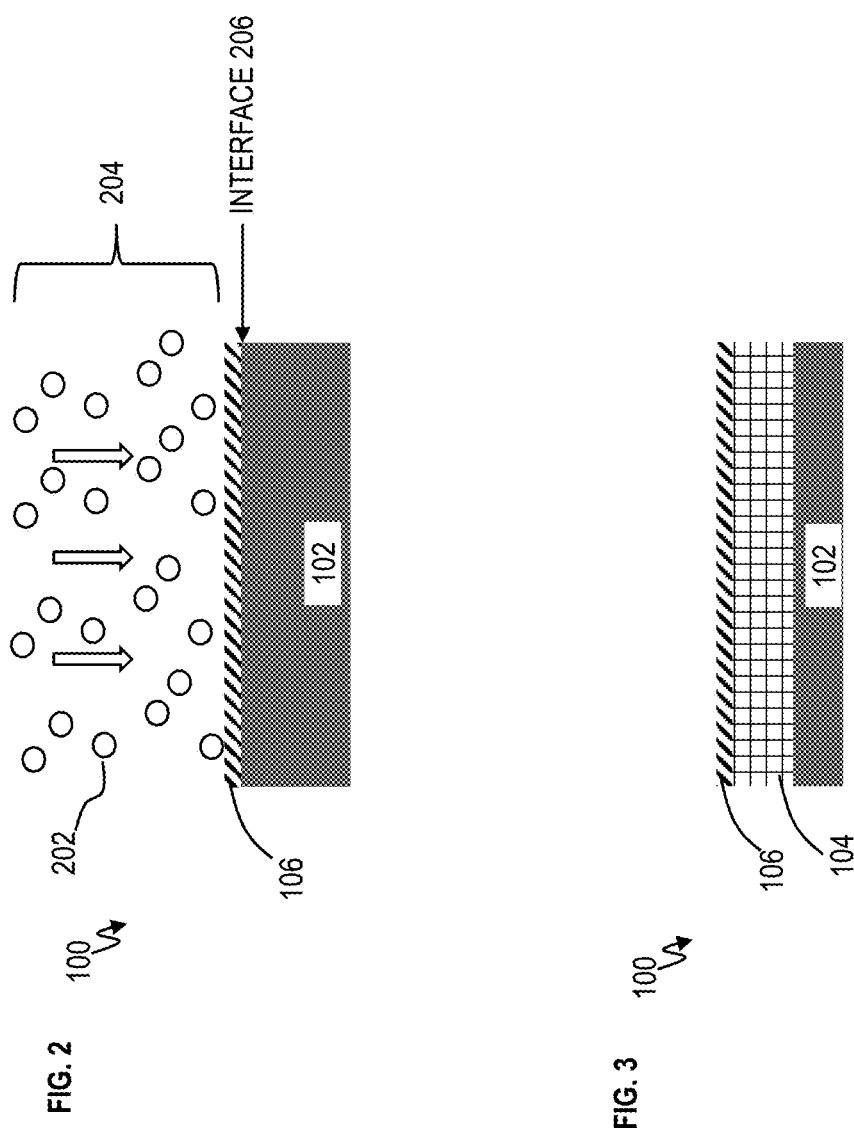

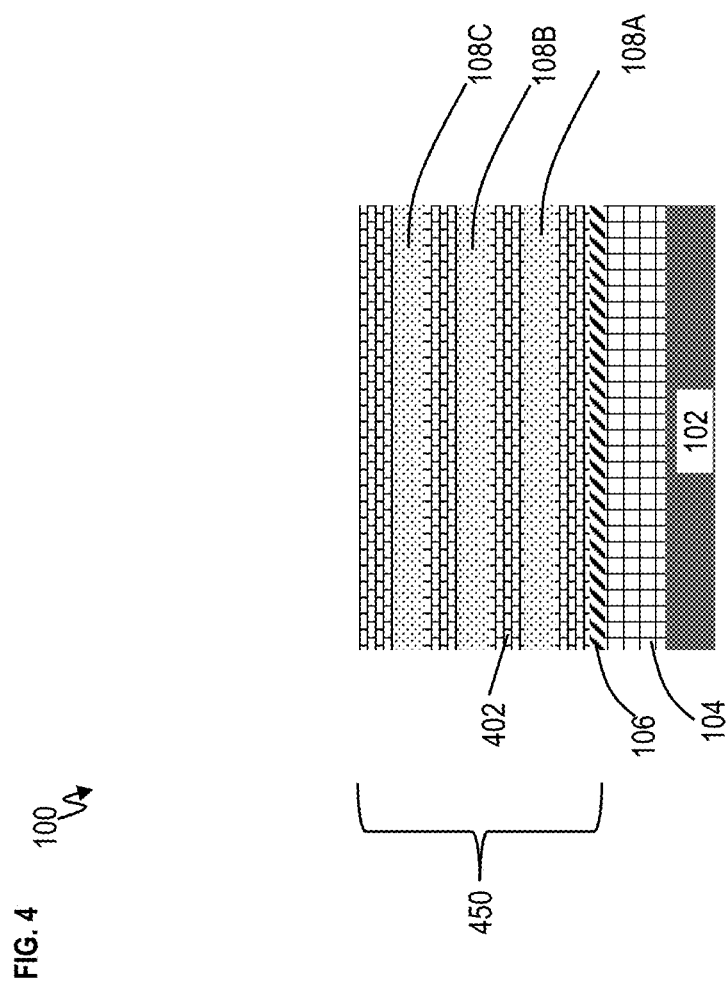

NANOSHEET FET BOTTOM ISOLATION

DOMESTIC PRIORITY

This application is a divisional of U.S. patent application Ser. No. 16/174,603, filed Oct. 30, 2018, the disclosure of which is incorporated by reference herein in its entirety.

BACKGROUND

The present invention generally relates to fabrication methods and resulting structures for semiconductor devices, and more specifically, to nanosheet FET bottom isolation.

In contemporary semiconductor device fabrication processes, a large number of semiconductor devices, such as n-type field effect transistors (nFETs) and p-type field effect transistors (pFETs), are fabricated on a single wafer. Non-planar transistor device architectures, such as nanosheet (or nanowire) transistors, can provide increased device density and increased performance over planar transistors. Nanosheet transistors, in contrast to conventional planar FETs, include a gate stack that wraps around the full perimeter of multiple nanosheet channel regions for improved control of channel current flow. Nanosheet transistor configurations enable fuller depletion in the nanosheet channel regions and reduce short-channel effects.

SUMMARY

Embodiments of the invention are directed to a method for forming a semiconductor device. A non-limiting example of the method includes forming a rare earth material on a substrate, forming an isolation layer at an interface of the rare earth material and the substrate, forming channel layers over the isolation layer, and forming source or drain (S/D) regions on the isolation layer.

Embodiments of the invention are directed to a semiconductor device. A non-limiting example of the semiconductor device includes a rare earth material formed on a substrate, an isolation layer formed at an interface of the rare earth material and the substrate, channel layers formed over the isolation layer, and source or drain (S/D) regions formed on the isolation layer.

Embodiments of the invention are directed to a method for forming an isolation layer for a semiconductor device. A non-limiting example of the method includes forming a rare earth oxide material on a substrate and diffusing oxygen through the rare earth oxide material such that an oxide is grown at an interface of the rare earth oxide material and the substrate, the oxide being the isolation layer. Also, the method includes forming channel layers over the isolation layer and forming source or drain (S/D) regions on the isolation layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2 depicts a cross-sectional view of the semiconductor device taken along line X (shown in FIG. 1A) after fabrication operations according to embodiments of the invention;

FIG. 3 depicts a cross-sectional view of the semiconductor device taken along line X (shown in FIG. 1A) after fabrication operations according to embodiments of the invention;

FIG. 4 depicts a cross-sectional view of the semiconductor device taken along line X (shown in FIG. 1A) after fabrication operations according to embodiments of the invention;

Figure 1A:
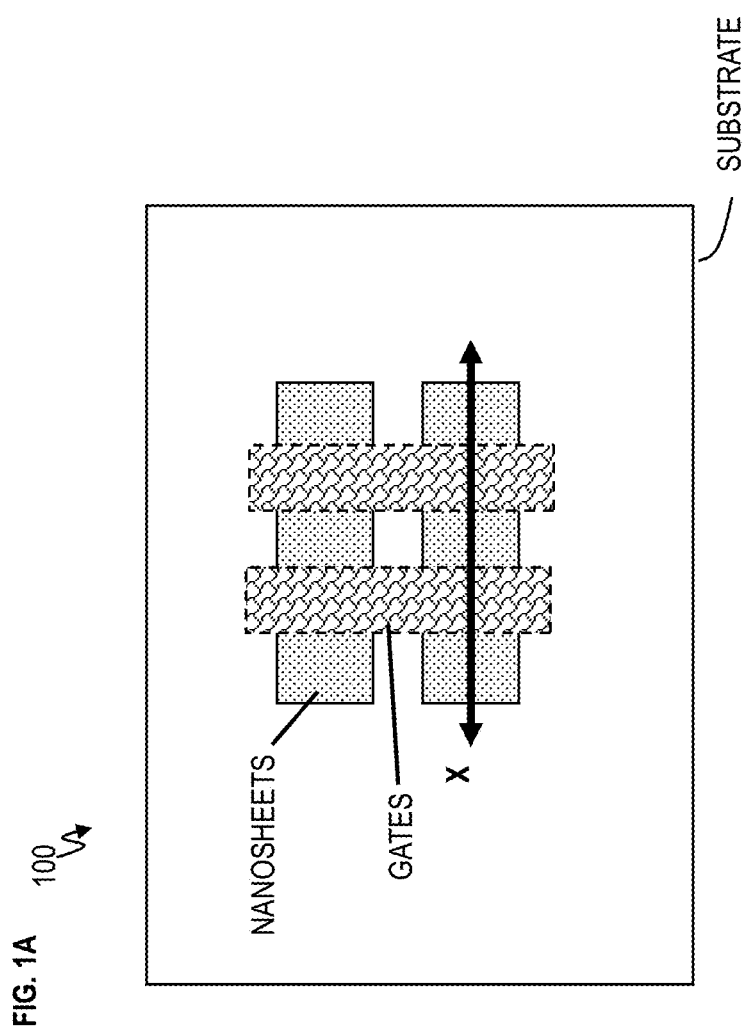
FIG. 1A depicts a simple diagram of a top view of a semiconductor device according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, a metal-oxide-semiconductor field-effect transistor (MOSFET) is used for amplifying or switching electronic signals. The MOSFET has a source, a drain, and a metal oxide gate electrode. The metal gate portion of the metal oxide gate electrode is electrically insulated from the main semiconductor n-channel or p-channel by the oxide portion of the metal oxide gate electrode. The oxide portion of the gate electrode can be implemented as a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers. Complementary metal oxide semiconductor (CMOS) is a technology that uses complementary and symmetrical pairs of p-type and n-type MOSFETs to implement logic functions.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

For nanosheet devices formed on a bulk substrate, the source and drain regions are epitaxially grown from the side of the silicon nanosheets and an upper surface of the silicon substrate. This leads to parasitic source and drain leakage harming nanosheet FET performance. Particularly, the combination of the epitaxy contacting the substrate in the source/drain region and the high-k metal gate (HKMG) stack formed directly on the substrate in the sub-fin region form a bottom parasitic planar transistor that can degrade the performance of the gate-all-around nanosheet-FET. Accordingly, a better integration scheme is needed.

Turning now to an overview of the aspects of the invention, one or more embodiments of the invention provide semiconductor devices and methods of forming the semiconductor devices. Embodiments of the invention provide integration methods to form full bottom dielectric isolation of nanosheet FETs by the oxygen diffusion through a rare earth oxide/silicon substrate interface. For example, a rare earth oxide buffer epitaxy layer is grown on, for example, a silicon substrate at the beginning of the process flow. The process includes oxygen diffusion through the rare earth oxide buffer layer to the silicon substrate interface, thereby forming a bottom silicon dioxide ($SiO_2$) dielectric layer. Utilizing the lattice matching (which can be heteroepitaxy or domain matching epitaxy) from the rare earth oxide buffer layer, a nanosheet layer stack (e.g., silicon germanium/silicon nanosheet layers) is epitaxially grown for downstream nanosheet device processes. Accordingly, the bottom dielectric isolation layer isolates the source/drain regions from the substrate and/or isolates the nanosheet region from the substrate.

Turning now to a more detailed description of aspects of the present invention, FIG. 1A depicts a simple diagram of a top-down view of a semiconductor device 100 according to embodiments of the invention. FIG. 1A is only for reference and illustrates a top-down view of locations of the nanosheets and gates for orientation purposes. For simplicity and ease of understanding, FIG. 1A omits some layers (elements) so as to not obscure the figure.

Figure 1B:
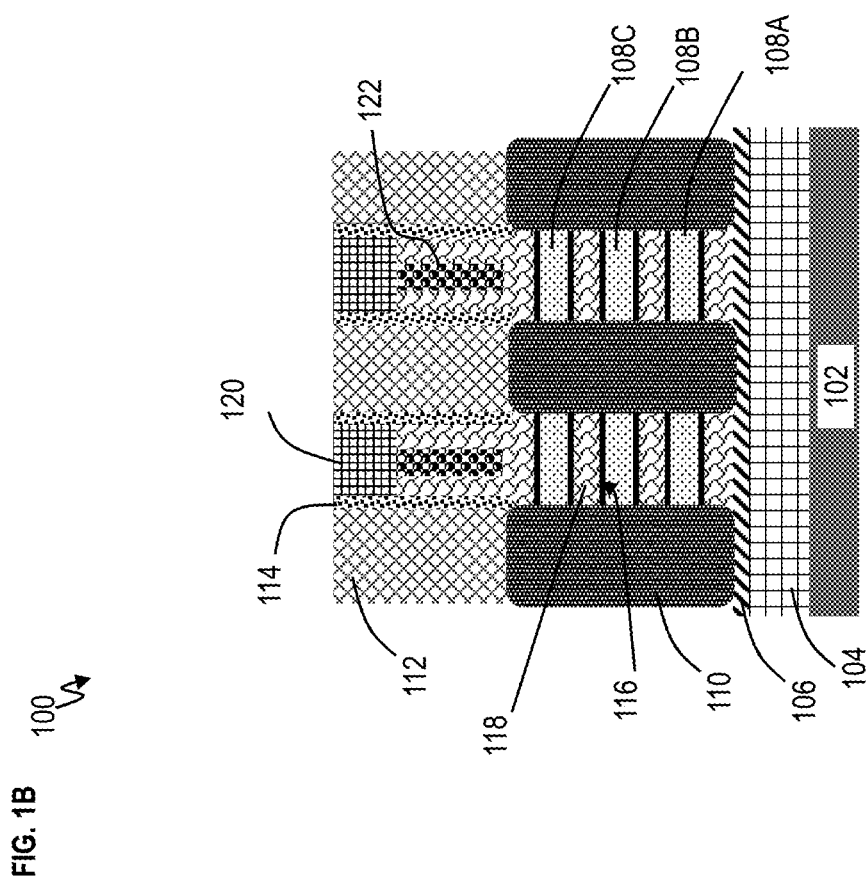
FIG. 1B depicts a cross-sectional view of the semiconductor device taken along line X in FIG. 1A after fabrication operations according to embodiments of the invention.

FIG. 1B depicts a cross-sectional view of the semiconductor device 100 shown in FIG. 1A taken along line X according to embodiments of the invention. In FIG. 1B, the semiconductor device 100 is a nanosheet FET device. The semiconductor device 100 has a bottom dielectric isolation layer 104 formed on a substrate 102. A rare earth material layer 106 has been formed on top of the bottom dielectric isolation layer 104.

Nanochannel layers 108A, 108B, 108C are formed over the bottom dielectric isolation layer 104. The nanochannel layers 108A, 108B, 108C are formed of nanosheet layers. Source and drain (S/D) epitaxial regions 110 are formed on ends of the nanochannel layer 108A, 108B, 108C. Inter-level dielectric (ILD) material 112 is formed on the S/D epitaxial regions 110. Spacers 114 are formed over the nanochannel layers 108A, 108B, 108C. A dielectric material 116 is formed around the nanochannel layers 108A, 108B, 108C, and work function material(s) 118 are formed around the dielectric material 116. A metal gate material 122 is formed on the work function material 118. A self-aligned contact (SAC) cap 120 is formed on top of the dielectric material 116, work function material 118, and metal gate material 122. Further details of fabricating the semiconductor device 100 are discussed below.

FIG. 2 depicts a cross-sectional view of the semiconductor device 100 shown in FIG. 1A taken along line X according to embodiments of the invention. FIG. 3 depicts a cross-sectional view of the semiconductor device 100 shown in FIG. 1A taken along line X according to embodiments of the invention. In FIG. 2, the rare earth material layer 106 is deposited on top of the substrate 102. The rare earth material layer 106 can have a thickness in a range of, for example, about 5 nm-20 nm. The rare earth material layer 106 is epitaxially grown from the substrate 102 so as to have lattice matching to the substrate 102 below. The rare earth material layer 106 is a buffer epitaxial layer on the substrate 102. The substrate 102 is formed of semiconductor material. The substrate 102 can be a silicon (Si) substrate, although other materials can be used. The substrate 102 can be a wafer. The rare earth material layer 106 is a rare earth oxide material, which is used in an oxygen diffusion process 204 of oxygen molecules 202 (e.g., 2) to create the bottom dielectric isolation layer 104 depicted in FIG. 3

In some embodiments of the invention, the rare earth material layer 106 includes cubic rare earth oxides because the experimenters have determined that cubic rare earth oxides work better with, for example, a silicon substrate 102 in preparation to form a nanosheet stack. Particularly, cubic rare earth oxides like $Gd_2O_3$ with a lattice constant 10.81 Å, $Nd_2O_3$ with a lattice constant 11.08 Å, and $Er_2O_3$ with a lattice constant 10.55 Å are nearly twice that of silicon with a lattice constant 5.43 Å. Cubic rare earth oxides (such, as for example, $Gd_2O_3$, $Nd_2O_3$, $Er_2O_3$, etc.) having a lattice constant about twice the lattice constant of silicon are thus considered to be compatible with silicon, and consequently, crystalline rare earth oxides can be epitaxially grown on a silicon substrate, as depicted in FIG. 2. More examples of cubic rare earth oxides for rare earth material layer 106 include $Y_2O_3$, $Pr_2O_3$, $Tb_2O_3$, etc. Other rare earth oxide materials that can be utilized which have similar lattice constants include $Sm_2O_3$ with lattice constant 10.93 Å and $Dy_2O_3$ with lattice constant 10.67 Å, and they yield lattice mismatch values of 0.663% compressive, and 1.78% tensile, respectively, in either epitaxial orientation to silicon.

Additionally, in some embodiments of the invention, pseudocubic rare earth oxides can also be utilized as the rare earth material layer 106. An example pseudocubic rare earth oxide is $LaAlO_3$ with a lattice constant of 3.82 Å and can be deposited at a 45° angle with respect to the lattice of a silicon substrate. Epitaxial lattice matching could be achieved between the film and substrate in various ways, for example, using an inline 45° degree crystal rotation.

Referring back to FIG. 2, the oxygen diffusion process 204 occurs in chamber such as a vacuum chamber. During the oxygen diffusion process 204, oxygen molecules 202 diffuse through the capping layer of the rare earth material layer 106 to the silicon substrate interface 206 and form the bottom dielectric isolation layer 104 depicted in FIG. 3. Continuing the example scenario in which the substrate 102 is silicon, as the oxygen molecules 202 diffuse through the rare earth material layer 106 and reach the surface (interface 206) of the silicon substrate 102, the oxygen molecules 202 combine with the silicon to form silicon dioxide ($SiO_2$) resulting in the bottom dielectric isolation layer 104. In one example, the rare earth oxide/silicon wafer is exposed to $O_2$ (infused into the chamber) at high temp (e.g., about 500° C.-700° C.) before the nanostack growth, for oxygen diffusion into the substrate thereby forming the $SiO_2$ bottom dielectric isolation layer 104. The thickness of the bottom dielectric isolation layer 104 can range from about 5 nm-20 nm. Although silicon is utilized to form silicon dioxide in this example, other substrate materials can be utilized to form an oxide.

Additionally, there can be options for higher oxidation rates. As one option for oxygen drive in, active oxygen species from electron cyclotron resonance (ECR) can be used, which results in a 4 to 5 fold increase in the oxygen rate on silicon. Accordingly, the thickness of the bottom dielectric isolation layer 104 can range from about 5 nm-50 nm. As another option for oxygen drive in, an atomic oxygen source can be used, which results in a 5 to 10 fold increase in the oxidation rate on silicon. Additionally, a thicker bottom isolation dielectric layer ($SiO_2$) could be formed by a higher diffusivity of molecular oxygen through the interfacial silicate layer between the rare earth oxide layer 106 and the silicon substrate 102.

FIG. 4 depicts a cross-sectional view of the semiconductor device 100 shown in FIG. 1A taken along line X according to embodiments of the invention. An epitaxial nanosheet stack 450 is formed. The epitaxial nanosheet stack 450 includes sacrificial layers 402 alternatingly formed with channel layer 108A, 108B, and 108C.

The channel layer 108A, 108B, and 108C can be generally referred to as channel layers 108. Although three channel layers 108 are shown, more or fewer channel layers 108 can be used, and the number of sacrificial layers 402 will be increased or decreased accordingly. The sacrificial layers 402 and channel layers 108 can be epitaxially grown. The lattice matching of, for example, heteroepitaxy or domain matching epitaxy, from the rare earth oxide layer 106 (capping layer) is used to grow epitaxially SiGe/Si nanosheet stack 450. The SiGe/Si nanosheet stack 450 does not directly contact the substrate 102. Instead, the SiGe/Si nanosheet stack 450 is formed on the rare earth oxide layer 106.

The sacrificial layers 402 are formed of a material that can be removed (i.e., etched) without etching the layers 108 in the stack 450. The sacrificial layers 402 can be silicon germanium (SiGe) which can be etched selective to silicon (e.g., silicon channel layers 108). The thickness or height of each sacrificial layer 402 can range from about 5 nm to 15 nm, and the height of each channel layer 108 can range from about 5 nm to 15 nm.

Figure 5:
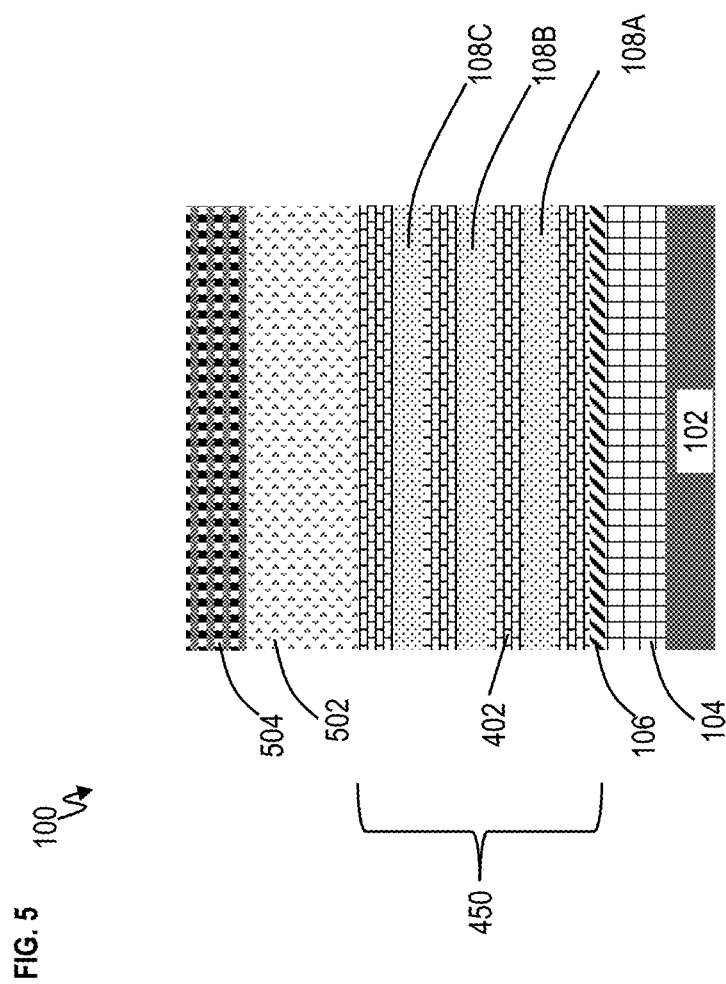
FIG. 5 depicts a cross-sectional view of the semiconductor device taken along line X (shown in FIG. 1A) after fabrication operations according to embodiments of the invention.

FIG. 5 depicts a cross-sectional view of the semiconductor device 100 shown in FIG. 1A taken along line X according to embodiments of the invention. A dummy gate layer 502 is formed on top of the upper sacrificial layer 402. The dummy gate layer 502 can be polycrystalline silicon (poly silicon), amorphous silicon, and/or an oxide, such as, $SiO_2$. A gate hardmask 504 is formed on the dummy gate material. The gate hardmask 504 can be a nitride, oxide, and/or a combination nitride and oxide material.

Figure 6:
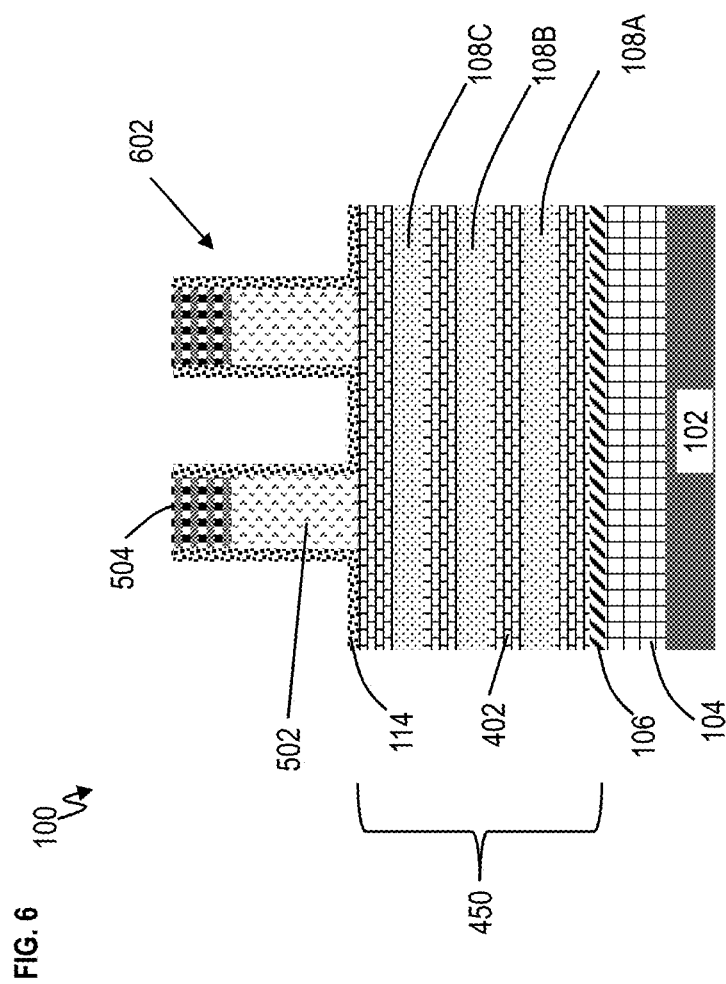
FIG. 6 depicts a cross-sectional view of the semiconductor device taken along line X (shown in FIG. 1A) after fabrication operations according to embodiments of the invention.

FIG. 6 depicts a cross-sectional view of the semiconductor device 100 shown in FIG. 1A taken along line X according to embodiments of the invention. Dummy gate etch and spacer deposition are performed. For example, gate patterning is formed by patterning the gate hardmask 504 and then using the patterned gate hardmask 504 to etch the dummy gate material 502 into the dummy gates 602. A spacer 114 is deposited on the top surface, and chemical mechanical planarization/polishing (CMP) can be performed to remove the spacer 114 from the top surface of the patterned gate hardmask 504.

Figure 7:
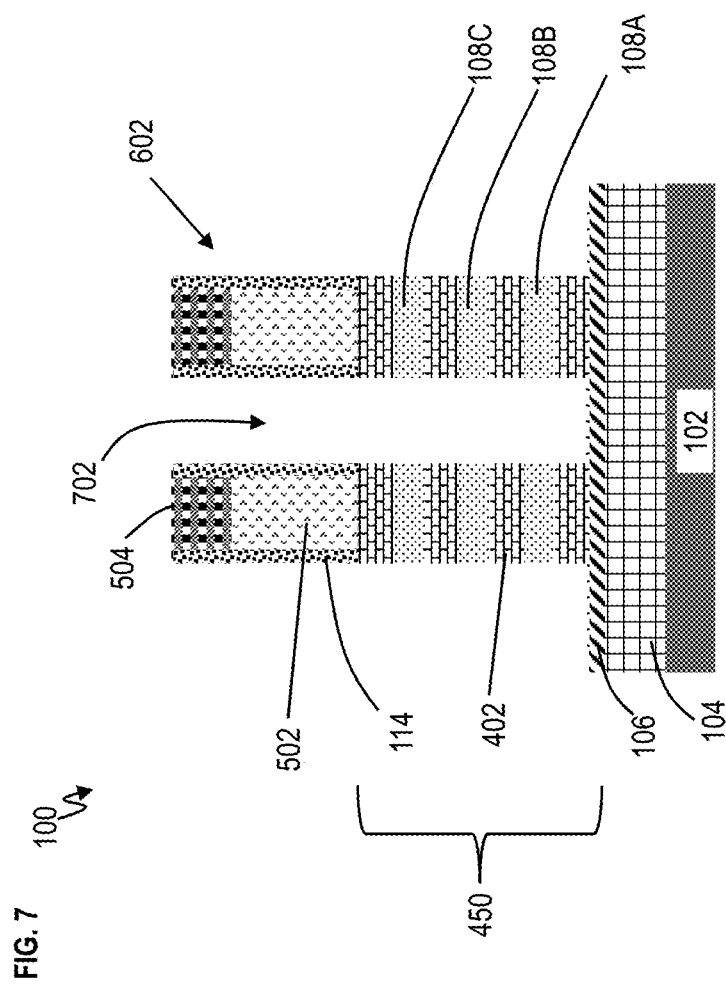
FIG. 7 depicts a cross-sectional view of the semiconductor device taken along line X (shown in FIG. 1A) after fabrication operations according to embodiments of the invention.

FIG. 7 depicts a cross-sectional view of the semiconductor device 100 shown in FIG. 1A taken along line X according to embodiments of the invention. Spacer etch and fin recess are performed. For example, reactive ion etch (ME) can be performed to remove portions of the spacer 114 from the top of the nanosheet stack 450, such that portions of the nanosheet stack 450 are exposed. A fin recess etch is performed to etch the sacrificial layers 402 and channel layers 108 of the nanosheet stack 450 stopping on the rare earth material layer 106, thereby creating openings 702 in preparation for source and drain regions. Directional RIE can be used during the fin recess.

Figure 8:
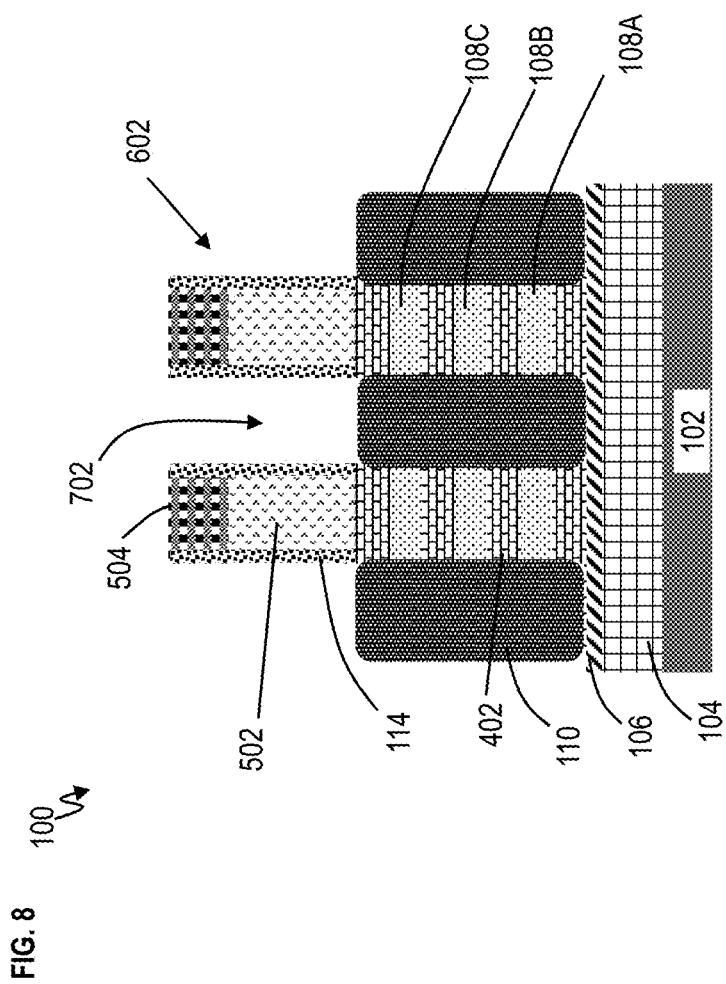
FIG. 8 depicts a cross-sectional view of the semiconductor device taken along line X (shown in FIG. 1A) after fabrication operations according to embodiments of the invention.

FIG. 8 depicts a cross-sectional view of the semiconductor device 100 shown in FIG. 1A taken along line X according to embodiments of the invention. Formation of source or drain (S/D) epitaxial regions 110 is performed. The S/D epitaxial regions 110 can be NFET source/drain epitaxial regions or PFET source/drain epitaxial regions according to formation of the NFET or PFET devices. Accordingly, the S/D epitaxial regions 110 can be doped with N-type dopants or P-type dopants as desired. The S/D epitaxial regions 110 can be epitaxially grown from the edges of the channel layers 108.

Figure 9:
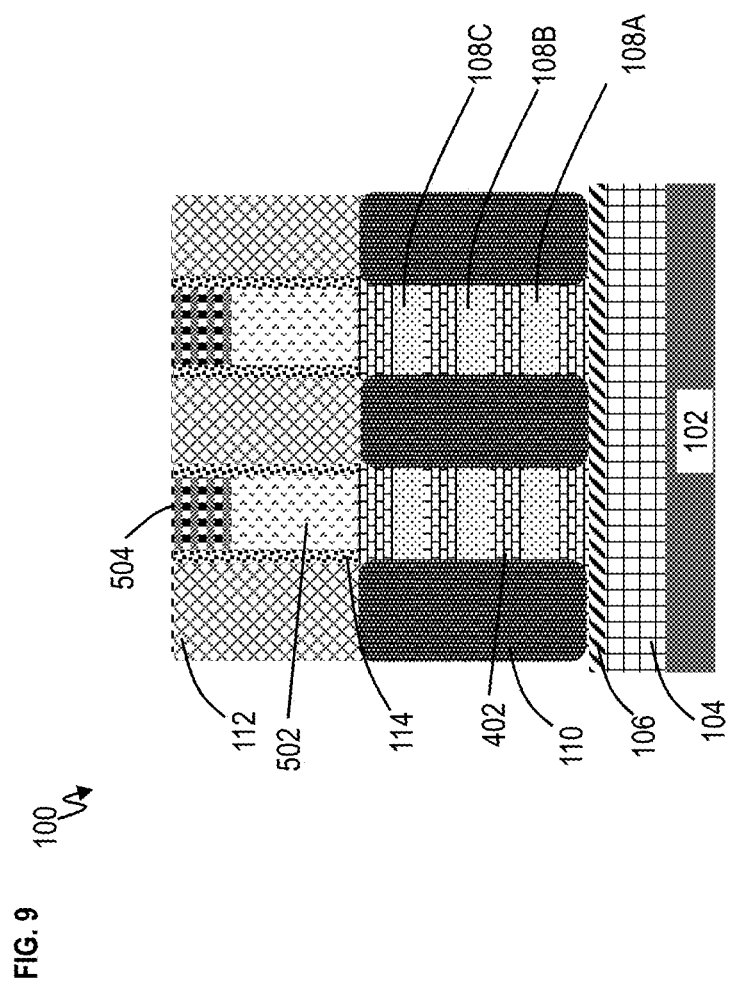
FIG. 9 depicts a cross-sectional view of the semiconductor device taken along line X (shown in FIG. 1A) after fabrication operations according to embodiments of the invention.

FIG. 9 depicts a cross-sectional view of the semiconductor device 100 shown in FIG. 1A taken along line X according to embodiments of the invention. An inter-level dielectric (ILD) material 112 is deposited to cap the S/D epitaxial regions 110. The ILD material 112 is a low-k dielectric material such as, for example, an oxide material like silicon dioxide. The ILD material 112 is then recessed by chemical mechanical polishing (CMP) until the gate hardmask layer 504 is reached.

Figure 10:
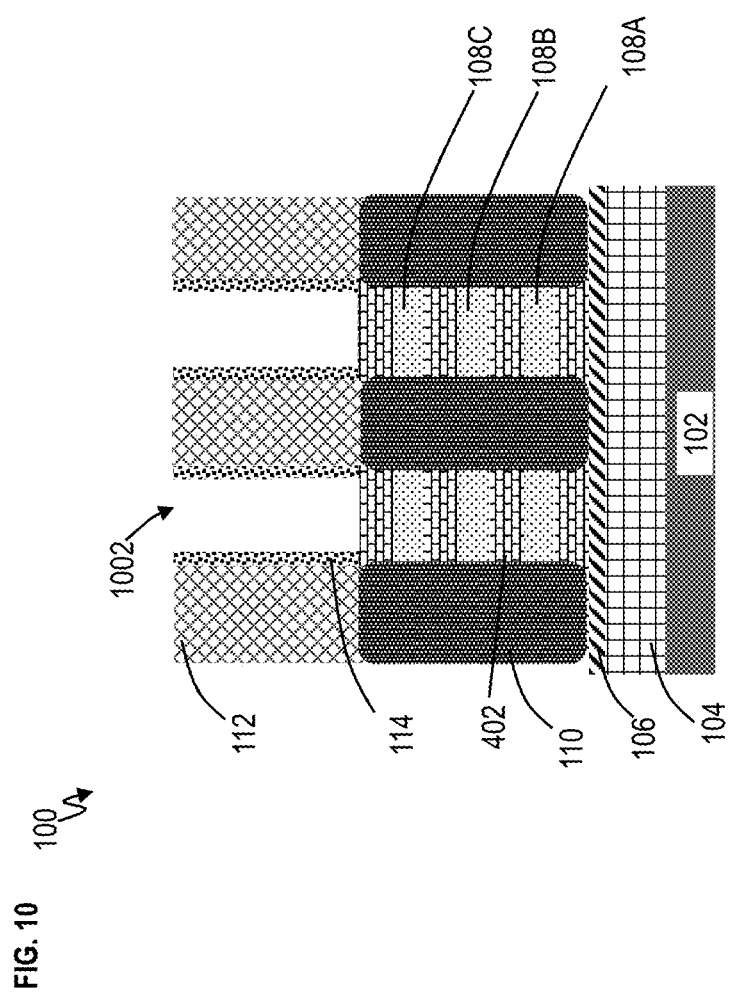
FIG. 10 depicts a cross-sectional view of the semiconductor device taken along line X (shown in FIG. 1A) after fabrication operations according to embodiments of the invention.
Figure 11:
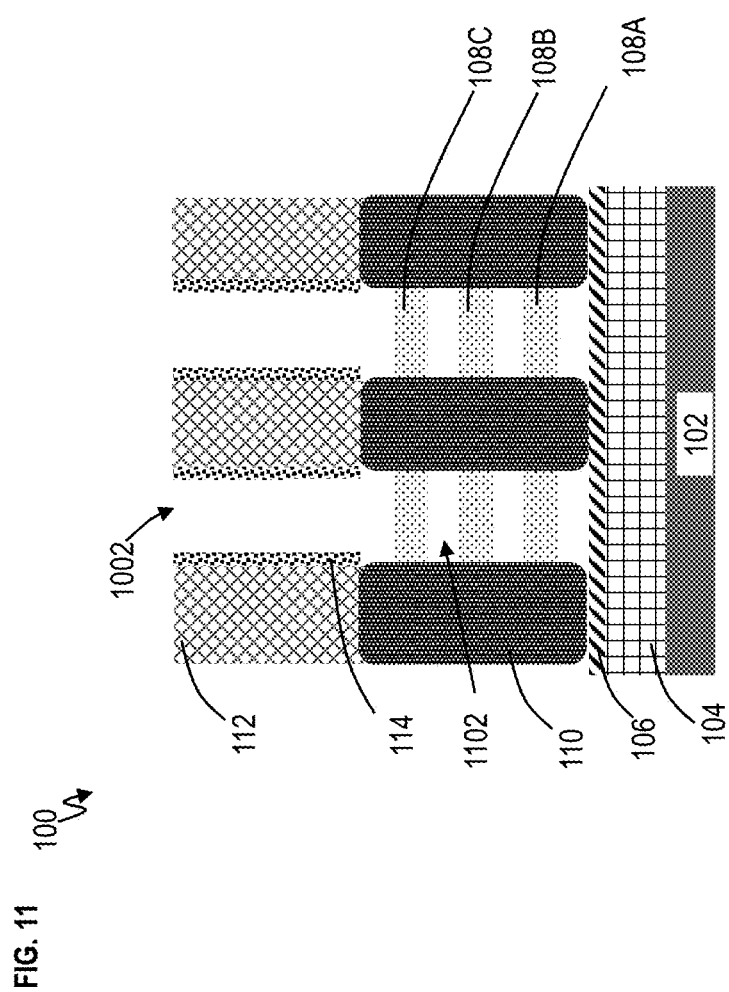
FIG. 11 depicts a cross-sectional view of the semiconductor device taken along line X (shown in FIG. 1A) after fabrication operations according to embodiments of the invention.
Figure 12:
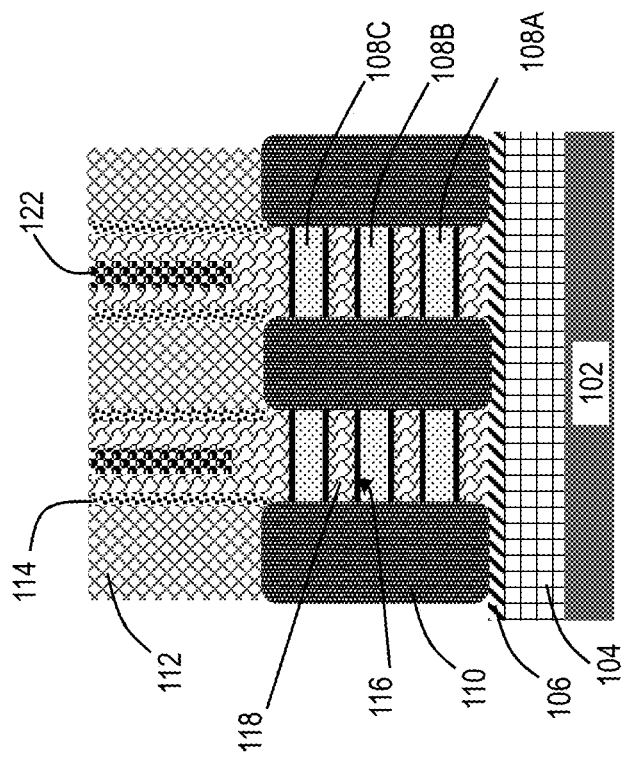
FIG. 12 depicts a cross-sectional view of the semiconductor device taken along line X (shown in FIG. 1A) after fabrication operations according to embodiments of the invention.

A replacement metal gate (RMG) process is performed, as depicted in FIGS. 10, 11, and 12. FIG. 10 depicts a cross-sectional view of the semiconductor device 100 shown in FIG. 1A taken along line X according to embodiments of the invention. The gate hardmask 504 is removed, and the dummy gate etch (e.g., poly pulldown) of the dummy gate material 502 is performed, resulting in trenches 1002 as depicted in FIG. 10. FIG. 11 depicts a cross-sectional view of the semiconductor device 100 shown in FIG. 1A taken along line X according to embodiments of the invention. Nanosheet channel release is performed. For example, etching is performed to remove the (SiGe) sacrificial layers 402 selective to the channel layers 108 (i.e., without removing the channel layers 108). In other words, the selective etching of the sacrificial layers 402 releases the channel layers 108, thereby creating openings 1102 between the channel layers 108. FIG. 12 depicts a cross-sectional view of the semiconductor device 100 shown in FIG. 1A taken along line X according to embodiments of the invention. Conformal high-k metal gate (HKMG) formation is performed to deposit HKMG layers which fill the previous openings 1002 and 1102. For example, dielectric layer 116 is deposited so as to wrap around the channel layers 108. One or more work function materials 118 are formed on the dielectric layer 116. Optionally, a metal gate layer 122 can be formed on the work function material 118. The metal gate layer 122 can include tungsten (W), copper (Cu), etc.

The dielectric layer 116 is a high-k gate dielectric material, for example, a dielectric material with a dielectric constant that is greater than the dielectric constant of silicon dioxide (i.e., greater than 3.9). Exemplary high-k dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.).

The work function material can include a work function metal that is immediately adjacent to the gate dielectric layer and that is preselected in order to achieve an optimal gate conductor work function given the conductivity type of the nanosheet-FET. For example, the optimal gate conductor work function for the PFETs can be, for example, between about 4.9 eV and about 5.2 eV. Exemplary metals (and metal alloys) having a work function within or close to this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The optimal gate conductor work function for NFETs can be, for example, between 3.9 eV and about 4.2 eV. Exemplary metals (and metal alloys) having a work function within or close to this range include, but are not limited to, hafnium, zirconium, titanium, tantalum, aluminum, and alloys thereof, such as, hafnium carbide, zirconium carbide, titanium carbide, tantalum carbide, and aluminum carbide. The metal layer 122 can further include a fill metal or fill metal alloy, such as tungsten, a tungsten alloy (e.g., tungsten silicide or titanium tungsten), cobalt, aluminum or any other suitable fill metal or fill metal alloy.

Figure 13:
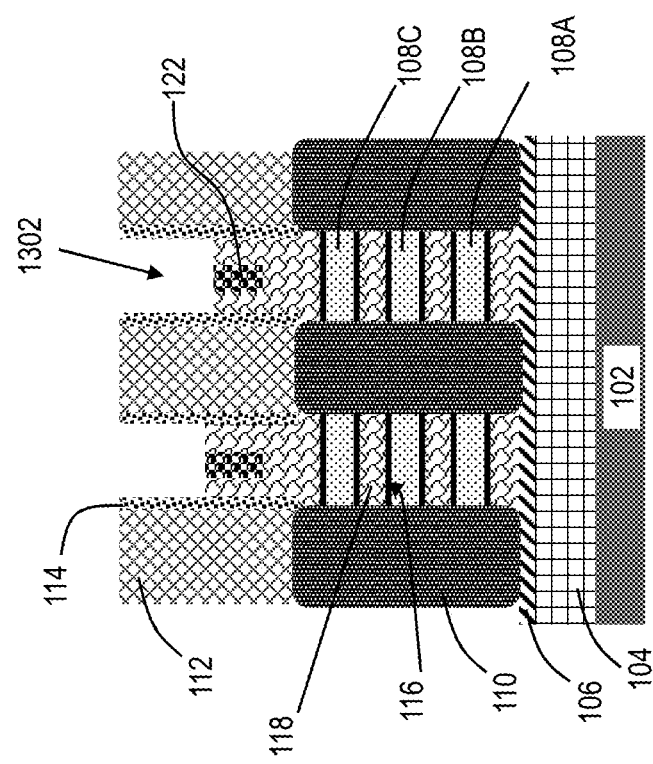
FIG. 13 depicts a cross-sectional view of the semiconductor device taken along line X (shown in FIG. 1A) after fabrication operations according to embodiments of the invention.

FIG. 13 depicts a cross-sectional view of the semiconductor device 100 shown in FIG. 1A taken along line X according to embodiments of the invention. A metal recess can be performed to recess the work function material 118 and the metal gate layer 122 in preparation to deposit the self-aligned contact (SAC) cap 120 depicted in FIG. 1B. The SAC cap 120 is an insulating material, such as, a nitride (e.g., SiN), an oxide (e.g., $SiO_2$), etc.

According to embodiments of the invention, a method of forming a semiconductor device 100 is provided. The method includes forming a rare earth material 106 on a substrate 102, forming an isolation layer 104 at an interface 206 of the rare earth material 106 and the substrate 102, forming channel layers 108 over the isolation layer 104, and forming source or drain (S/D) regions 110 on the isolation layer 104.

Also, the method includes forming a dielectric layer 116 on the channel layers 108A, 108B, 108C, and forming one or more work function materials 118 on the channel layers 108. The one or more work function materials 118 are on the isolation layer 104. The isolation layer 104 separates a portion of the one or more work function materials 118 from the substrate 102. The isolation layer 104 physically separates and electrically isolates the S/D regions 110 from the substrate 102.

The rare earth material 106 is a rare earth oxide. The rare earth material 106 is a rare earth oxide with a cubic lattice. The rare earth material 106 is a rare earth oxide having a lattice constant that is about twice a lattice constant of a material of the substrate 102. A lattice structure of the rare earth material 106 about matches a lattice structure of the channel layers 108.

Also, the method includes forming the isolation layer 104 at the interface 206 of the rare earth material 106 on the substrate 102 includes diffusing oxygen through the isolation layer 104 and growing the isolation layer 104 at the interface 206. The isolation layer 104 is an oxide material. The isolation layer 104 is formed as an oxide of a material of the substrate 102.

According to embodiments of the invention, a method of forming an isolation layer 104 for a semiconductor device 100. The method includes forming a rare earth oxide material 106 on a substrate 102, diffusing oxygen 204 through the rare earth material 106 such that an oxide is grown at an interface 206 of the rare earth oxide material and the substrate, the oxide being the isolation layer 104. The method includes forming channel layers 108 over the isolation layer 104 and forming source or drain (S/D) regions 110 on the isolation layer 104.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
a rare earth material formed on a substrate;
an isolation layer formed in between the rare earth material and the substrate, the isolation layer being in direct contact with both the rare earth material and the substrate;
channel layers formed over the isolation layer; and
source or drain (S/D) regions formed on the isolation layer, the S/D regions formed on end surfaces of the channel layers, the S/D regions and the isolation layer sandwiching the rare earth material, the S/D regions being in direct contact with the rare earth material.

2. The semiconductor device of claim 1, wherein a dielectric layer is on the channel layers.

3. The semiconductor device of claim 1, wherein one or more work function materials are formed on the channel layers and on the isolation layer.

4. The semiconductor device of claim 3, wherein the isolation layer separates the one or more work function materials from the substrate.

5. The semiconductor device of claim 1, wherein the isolation layer physically separates and electrically isolates the S/D regions from the substrate.

6. The semiconductor device of claim 1, wherein the rare earth material comprises a rare earth oxide.

7. The semiconductor device of claim 1, wherein the rare earth material comprises a rare earth oxide with a cubic lattice.

8. The semiconductor device of claim 1, wherein the rare earth material comprises a rare earth oxide having a lattice constant that comprises about twice a lattice constant of a material of the substrate.

9. The semiconductor device of claim 1, wherein a lattice structure of the rare earth material substantially matches a lattice structure of the channel layers.

10. The semiconductor device of claim 1, wherein the isolation layer comprises an oxide material.

11. The semiconductor device of claim 1, wherein the isolation layer is formed as an oxide of a material of the substrate.

12. The semiconductor device of claim 1, wherein the isolation layer comprises silicon.

13. The semiconductor device of claim 1, wherein the isolation layer comprises silicon dioxide.

14. The semiconductor device of claim 1, wherein the isolation layer comprises oxygen molecules.

15. The semiconductor device of claim 1, wherein a dielectric layer is on the channel layers and the dielectric layer is comprises a dielectric constant greater than 3.9.

16. The semiconductor device of claim 15, wherein the dielectric layer comprises hafnium.

17. The semiconductor device of claim 15, wherein the dielectric layer comprises aluminum.

18. The semiconductor device of claim 15, wherein the dielectric layer comprises tantalum.

19. The semiconductor device of claim 15, wherein the dielectric layer comprises zirconium.

20. The semiconductor device of claim 1, wherein the S/D regions are formed directly on the rare earth material.

* * * * *